(12) United States Patent
Meli

(10) Patent No.: US 6,657,451 B2
(45) Date of Patent: Dec. 2, 2003

(54) METHOD AND INTEGRATED CIRCUIT ARRANGED FOR FEEDING A TEST FORCING PATTERN ON A SINGLE SHARED PIN OF THE CIRCUIT

(75) Inventor: Louis Marcel Meli, Kuesnacht (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 400 days.

(21) Appl. No.: 09/725,418

(22) Filed: Nov. 29, 2000

(65) Prior Publication Data

US 2001/0002790 A1 Jun. 7, 2001

(30) Foreign Application Priority Data

Nov. 29, 1999 (EP) .......... 99204015

(51) Int. Cl.[7] .......... G01R 31/02
(52) U.S. Cl. .......... 324/765; 324/537; 324/73.1
(58) Field of Search .......... 324/765, 763, 324/537, 73.1; 702/117; 714/734, 773, 733, 741

(56) References Cited

U.S. PATENT DOCUMENTS

| | | | | |
|---|---|---|---|---|
| 5,109,190 A | * | 4/1992 | Sakashita et al. | 324/73.1 X |
| 5,161,159 A | * | 11/1992 | McClure et al. | 324/158.1 X |
| 5,198,758 A | * | 3/1993 | Iknaian et al. | 324/73.1 X |
| 5,457,400 A | * | 10/1995 | Ahmad et al. | 324/763 |
| 6,101,457 A | * | 8/2000 | Barch et al. | 324/73.1 X |
| 6,157,201 A | * | 12/2000 | Leung et al. | 324/760 |

* cited by examiner

Primary Examiner—N. Le
Assistant Examiner—T R Sundaram
(74) Attorney, Agent, or Firm—Aaron Waxler

(57) ABSTRACT

An integrated circuit is forced into a test mode through executing the following steps: presenting a test forcing pattern on a subset of the circuit's external pins for driving the circuit to a test mode, presenting the electronic test forcing pattern to the circuit and finally executing the test proper. In particular, the following steps are implemented: presenting the pattern on a single pin in the form of an aggregate of a clocking sequence and a transition signalling data sequence as input data for an on-circuit storage element; clocking the storage element by a delayed version of the test forcing pattern; sequentially storing successive data parts of the test forcing pattern under control of successive clock parts of the delayed test forcing pattern; matching a predetermined string of the stored data parts versus a standard pattern, and upon finding a match driving the circuit to a test condition for then executing a test procedure.

11 Claims, 2 Drawing Sheets

METHOD AND INTEGRATED CIRCUIT ARRANGED FOR FEEDING A TEST FORCING PATTERN ON A SINGLE SHARED PIN OF THE CIRCUIT

BACKGROUND OF THE INVENTION

The invention relates to a system for entering an electronic test pattern into an intergrated circuit. The testing proper should be effected through using only a low number of test data pins. The presenting of selfclocking test data as a serial string would need only a single pin. However, a principal problem then remains to recognize the instant of a transition from normal or functional usage to testing. An advantageous test methodology would, for controlling this transition, need no additional and reserved control pin that would have no usage in the functional mode. Importantly, the circuit should not slip into the test mode during normal usage due to some signal pattern that were then received on the pin that would be used for receiving the test forcing pattern. The signals that were to control the transition should thus be made readily and uniformly distinguishable from the signals that would be presented in normal use to the pin in question.

Various older proposals have been brought forward, inter alia the use of two pins to enter a special test sequence into an in-circuit shift register, which scheme would necessitate more test control pins. An alternative to the present invention is to apply a high voltage to steer the circuit to the test mode. Although this would by itself represent a reliable procedure, the necessity for coping with such a higher voltage would require taking extra measures for good insulation and the like. Generally, it would be advisable for reasons of low cost to use only a single pin for presenting a pattern that would serve to detect an impending start of a test procedure, and to use signals at or near standard voltage levels.

SUMMARY TO THE INVENTION

In consequence, amongst other things, it is an object of the present invention to signal an impending transition to a test procedure by using only a single test pin and to apply thereto signals at or near standard voltages.

Now therefore, according to one of its aspects the invention is a system or entering an electronic test pattern into an integrate circuit.

The invention also relates to a method of entering an electronic test pattern into an integrate circuit.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
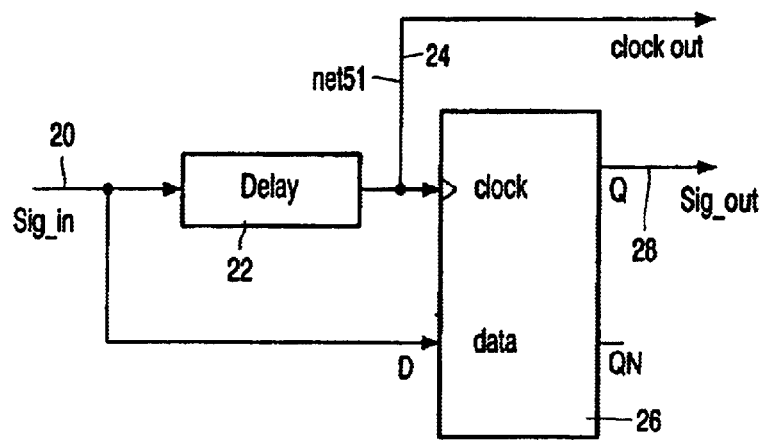
FIG. 1, a part of the basic circuitry for realizing the invention.

FIG. 1 represents an embodiment of basic circuitry for realizing the present invention. The input signal sig_in is applied to the data input of flipflop 26, and in parallel therewith to delay element 22. The delayed signal feeds the clock input of flipflop 26, and is furthermore used as signal clock out on line 24 for further use, cf. infra. Flipflop 26 through clocking by the output signal of delay element 22, allows the signal on its data output Q to be used as sig_out 28. The inverted output QN is not used in the embodiment.

The clock is recovered by delaying the signal. For a logic "1", the signal should have an "on"-time that is longer than the delay. For a logic "0", the signal should have an "on"-time that is shorter than the delay. The approach thus effectively taken needs only a single pin to convey both clock and data information to an on-chip shift register, thereby reducing the problem to find only a single pin to enter the test mode, whilst still allowing this single test pin to be also used for other general purpose functions. It should be noted that the transition to the test situation cannot be clocked by the standard clock input to the circuit, because of the lack of mutual synchronization between the external tester facilities and the normal clock source of the circuit.

In order to convey both clock and data information, such skew problems existing in the circuit are now turned in an advantage. A certain pulse-coded modulation is used to encode both data and also the test clack signal. The test clock will be recovered by delaying the input signal to generate a latching control of a digital memory element.

Therefore, the input signal now has a period P and a time width W, when it will be asserted, the memory element clock having a delay D. If now, D>W, the flipflop output will be zero. If D<W, the flipflop output will be one. This has been shown in FIG. 3. The recovered data will show distinct transition instants. Since both the clock signal and the data information have now been encoded within the same signal sequence, the only major constraint in generating the test signal lies in the allowed relationship between the delay and the pulse width.

The pin to be chosen for entering the test pattern should at reset of the circuit be defined as either an input or as an I/O pin. Furthermore, to reduce the probability for entering the test mode during normal usage the following is proposed. The delay interval chosen should be such that that in any application the toggling of the pin in question should never generate a shorter pulse than corresponding to the delay interval. If necessary, this may be effected by a variable delay interval, for example, through the use of a tunable phase-locked-loop PLL device. For reaching a sufficiently low probability of a false recognition, the shift register depth may be increased, and also the test keys may be chosen carefully.

In situations where a 50% duty cycle is necessary to correctly clock the shift register, a system may be realized wherein the data is being repeated. A "logic zero" would then be represented by a series of two "0"-bits. Likewise, a "logic one" would then be represented by a series of two "1"-bits. This will allow to divide the clock train to be divided by 2 for obtaining the correct duty cycle through inserting the divider after delay item 22. The test control signals themselves may be easily generated on any standard digital tester.

Figure 2:
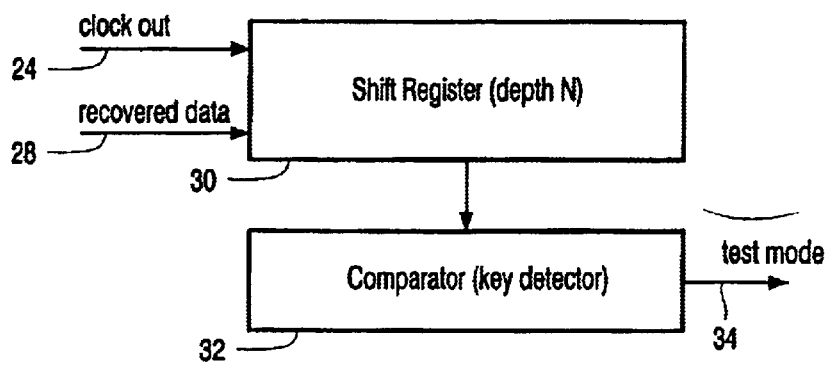
FIG. 2 a shift register annex a comparator to detect the test sequence.

FIG. 2 shows an N-bit shift register 30 of a sufficient depth that is used together with a comparator 32 to detect the test sequence. Shift register 30 receives the clock out on line 24 from the arrangement of FIG. 1. Furthermore, shift register 30 receives as input signal sig_out on line 28 from flipflop 26 in FIG. 1. The shift register 30 presents its contents in parallel to comparator or key detector 32; upon detecting the actual key configuration, a test mode control signal is presented on line 34.

Figure 3:
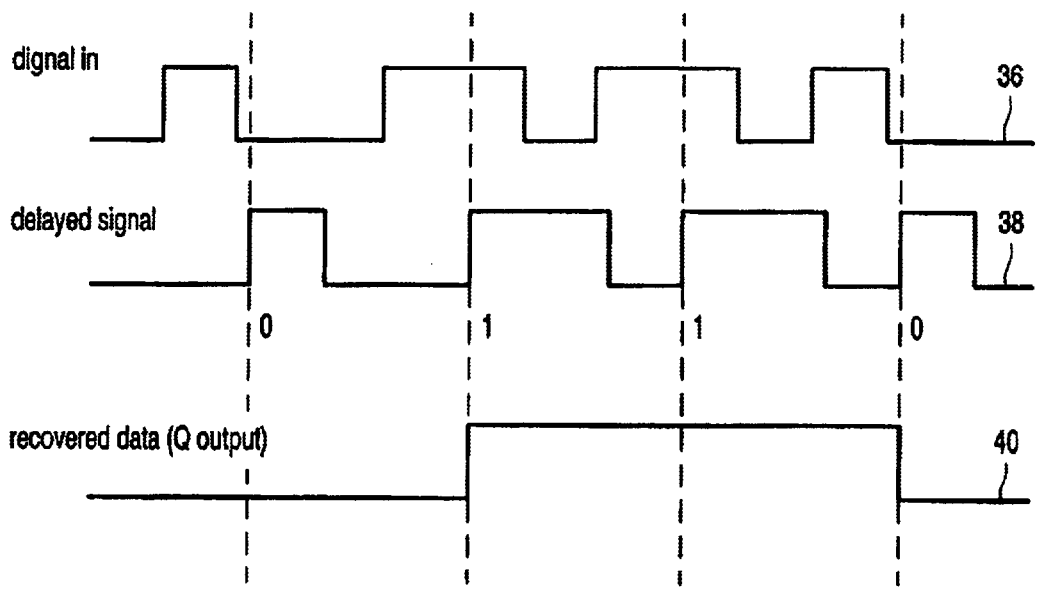
FIG. 3, waveforms inside and behind the flipflop.

FIG. 3 shows waveforms inside and behind the flipflop, with the bit cell boundaries shown by vertical interrupted lines. As long as the signal on curve 36 is less than 50% high, the recovered data curve 40 remains low. Only when the input signal is longer than 50% high, the delayed signal 38 will load the flipflop with the actual high signal in value.

Figure 4:
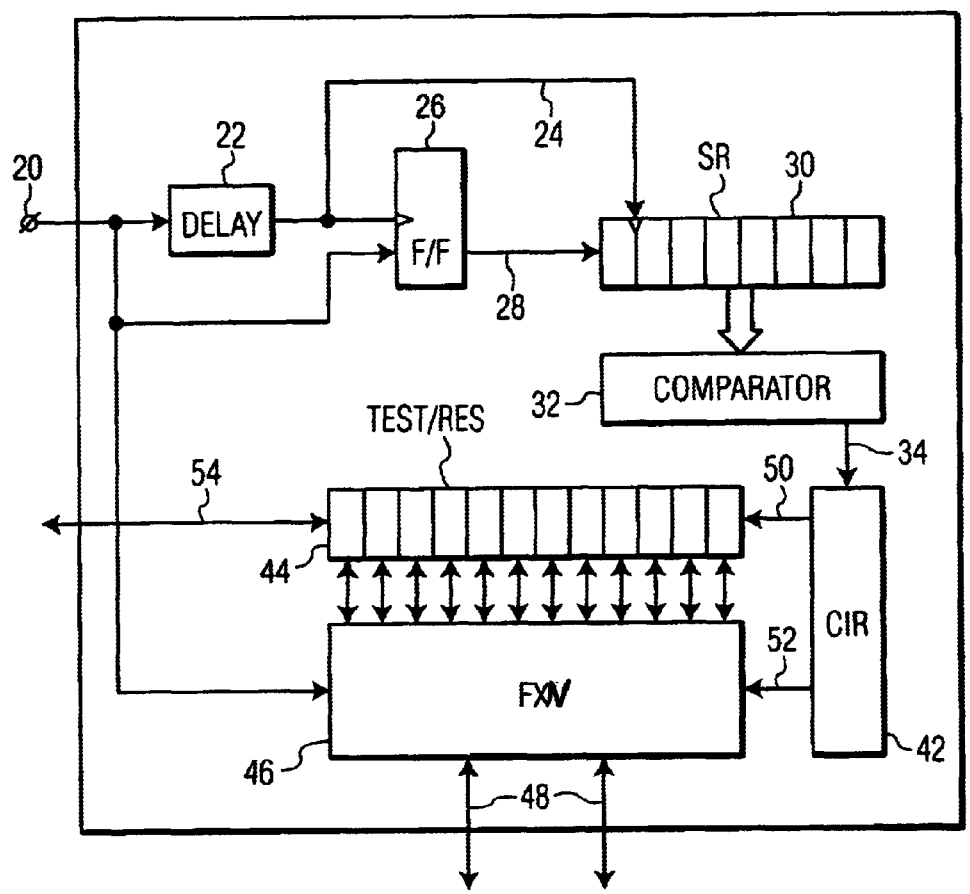
FIG. 4, an overall view of the testable integrated circuit.

FIG. 4 represents an overall view of a testable integrated circuit embodiment according to the present invention. Numbered items 20–34 in FIGS. 1, 2 have the same numbering in this instant and warrant no further disclosure. The test mode signalization signal on line 34 will activate test control circuit 42, which will then drive the overall circuit functionality, notably items 44, 46, in a test mode. The test mode may be maintained by a bistable element within circuit block 42 that is set by the test mode forcing signal on line 34, so that the test mode will no prematurely be terminated. The resetting of this bistable circuit element may be effected in one of various ways: through a human operator, through a test unforcing pattern received on input 20, through the elapsing of a preset time interval, or through some other mechanism.

Item 44 is a test/result register storage, that will bidirectionally communicate with the overall functionality 46 of the circuit proper. The latter may exchange data and control with an external world on lines 48 that on a wire-by-wire basis may be simplex in either direction, half-duplex or full-duplex. The communication between external tester facilities not shown and register facility 44 is via line 54, that may have an arbitrary layout that is not pertinent to the present invention. If relevant, during the test also input 20 may contribute to the testing data path width, and if applicable, even represent all necessary input facilities for a serial test pattern. Also, register 30 may be used during the test procedure proper. Although not shown expressly through communication with part 46, during non-test times also pin 20 can be used for attaining the standard circuit functionality through forming part of the overall Input functionality or Input/Output functionality, through communicating data and/or control signals.

Figure 5:
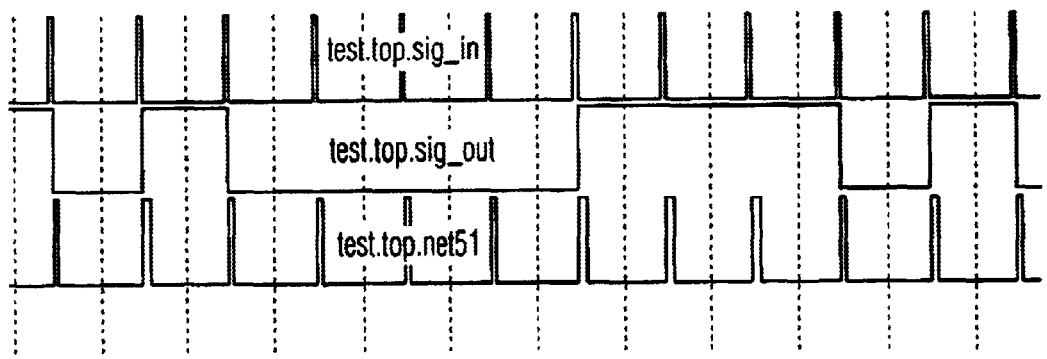
FIG. 5, simulated signals pertaining to the flipflop, supra.

FIG. 5 shows simulated signals pertaining to the flipflop of FIG. 1, supra. The top curve represents the signals on input 20 in FIG. 1. The lowest curve represents the output signals from delay element 22. The middle curve represents the output signals from flipflop 26 on line 28.

What is claimed is:

1. A method for entering an electronic test pattern into an integrated circuit, comprising the steps of:

presenting a test forcing pattern on a subset of the circuit's external pins for driving the circuit to a test mode, said subset being arranged for also communicating non-test-related patterns with the circuit's functional interior, presenting the electronic test pattern to the circuit and executing the test proper, said method being characterized by the following steps:

presenting said test forcing pattern on a single one circuit pin which is a member of said subset in the form of an aggregate of a clocking sequence and a transition signalling data sequence as data to an in-circuit storage element;

clocking said storage element by a delayed version of said test forcing pattern;

sequentially storing successive data parts of said pattern in said storage element under successive control of clock parts of said pattern as delayed;

matching a predetermined string of said data parts as stored versus a standard pattern, and Upon finding a match driving said circuit to a test condition for therein executing a test procedure.

2. An integrated circuit being arranged for entering an electronic test pattern and having first receiving means for receiving a test forcing pattern on a subset of the circuit's external pins for driving the circuit to a test mode, said subset being arranged for also communicating non-test-related patterns with the circuit's functional interior, and second receiving means for receiving the electronic test pattern to the circuit for executing the test proper, said circuit being characterized in that said first subset is a single one circuit pin arranged for receiving said test forcing pattern in the form of an aggregate of a clocking sequence and a transition signalling data sequence as data to an in-circuit storage element;

delay means for receiving said test forcing pattern for clocking said storage element by a delayed version of said test forcing pattern;

said storage element thereby sequentially storing successive data parts of said pattern under successive control of clock parts of said pattern as delayed;

matching means for matching a predetermined string of said data parts as stored versus a standard pattern, and for upon finding a match driving said circuit to a test condition for therein executing a test procedure.

3. A circuit as claimed in claim 2, wherein said storage element is a one-bit flipflop followed by a secondary storage facility.

4. A circuit as claimed in claim 3, wherein said secondary storage facility is a one-bit wide shift register.

5. A circuit as claimed in claim 2, wherein said single one circuit pin is arranged for, next to receiving said test forcing pattern, either inputting or inputting/outputting other data and/or control signals with respect to said circuit.

6. A circuit as claimed in claim 2, wherein a delay element and storage element are arranged for from said test forcing pattern storing a first data value under control of a pattern bit cell that has a first signal level during a time interval that is longer than half of its bit cell from a signal transition that activates storage and for from said test forcing pattern storing a second data value under control of a pattern bit cell that has a first signal level during a time interval that is shorter than half of its bit cell from a signal transition that activates storage.

7. A circuit as claimed in claim 2, wherein a delay has such value that in no application toggling of the pin in question will generate a shorter pulse than corresponding to a delay interval.

8. A circuit as claimed in claim 7 wherein a delay value is adjustable.

9. A circuit as claimed in claim 4, wherein said test forcing pattern is built up from consecutively paired logic "ones" and "zeroes", respectively, and said shift register is arranged for receiving a clock signal of approximately 50% duty cycle that is formed through a division-by-two of said delayed version.

10. A system for entering an electronic test pattern into an integrated circuit, said integrated circuit having first receiving means for receiving a test forcing pattern on a subset of the circuit's external pins for driving the circuit to a test mode, said subset being arranged for also communicating non-test-related patterns with the circuit's functional interior, and second receiving means for receiving the electronic test pattern to the circuit for executing the test proper, said circuit being characterized in that said first subset is a single one circuit pin arranged for receiving said test forcing pattern in the form of aggregate of a clocking sequence and a transition signalling data sequence as data to an in-circuit storage element;

delay means for receiving said test forcing pattern for clocking said storage element by a delayed version of said test forcing pattern;

said storage element thereby sequentially storing successive data parts of said pattern under successive control of clock parts of said pattern as delayed;

matching means for matching a predetermined string of said data parts as stored versus a standard pattern, and for upon finding a match driving said circuit to a test condition for therein executing a test procedure, wherein said single one circuit pin allows for entering said test forcing pattern as well as communicating further signalizations during said test mode, and wherein in said test condition said circuit has a hold device for at least provisionally maintaining said test condition.

11. A system as claimed in claim 10, wherein said single one circuit pin is arranged for at reset of the circuit being defined as either an input pin or an I/O pin.

* * * * *